(12) United States Patent
Hall et al.

(10) Patent No.: US 7,024,637 B2
(45) Date of Patent: Apr. 4, 2006

(54) FUNCTIONALITY BASED PACKAGE DESIGN FOR INTEGRATED CIRCUIT BLOCKS

(75) Inventors: Jeffrey A. Hall, San Jose, CA (US); Aritharan Thurairajaratnam, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 281 days.

(21) Appl. No.: 10/673,721

(22) Filed: Sep. 29, 2003

(65) Prior Publication Data

US 2005/0077602 A1    Apr. 14, 2005

(51) Int. Cl.
*G06F 17/50*    (2006.01)
(52) U.S. Cl. ............... 716/1; 716/9; 716/12; 716/14
(58) Field of Classification Search ............... 716/1, 716/9, 12, 14; 703/1
See application file for complete search history.

(56) References Cited

U.S. PATENT DOCUMENTS 6,110,213 A  *  8/2000  Vinciarelli et al. ............ 703/1

* cited by examiner

*Primary Examiner*—Thuan Do
(74) *Attorney, Agent, or Firm*—Luedeka, Neely & Graham, P.C.

(57) ABSTRACT

A method of designing a packaged circuit, including a substrate and a circuit. The circuit is designed with a plurality of standardized functional blocks. Each of the functional blocks has a known function and a known contact pattern. The circuit is designed by selecting desired functional blocks according to functions desired for the circuit. The substrate is designed with a plurality of standardized functional blocks. Each of the functional blocks has a known contact pattern, a known signal trace routing layer pattern, a known ground plane layer pattern, and a known power plane layer pattern. A given one of the substrate functional blocks is associated with a given one of the circuit functional blocks. The substrate is designed by selecting substrate functional blocks associated with the desired ones of the circuit functional blocks.

12 Claims, 13 Drawing Sheets

FUNCTIONALITY BASED PACKAGE DESIGN FOR INTEGRATED CIRCUIT BLOCKS

FIELD

This invention relates to the field of integrated circuit fabrication. More particularly, this invention relates to package design for integrated circuits.

BACKGROUND

As integrated circuits become more complex, more electrical connections are required between the integrated circuit and the rest of the circuit in which it is used. However, at the same time during which integrated circuits have become more complex, they have also become much smaller. Thus, more electrical connections for an integrated circuit are required, and within a smaller amount of space, than at any previous time.

Typically an integrated circuit is packaged in some manner, and among other functions such as protecting the integrated circuit, it is the job of the package to route signals to and from the integrated circuit in a manner that the electrical connections needed for such can be relatively easily made. Thus, contacts are provided for making electrical connections between the package substrate and the integrated circuit, which contacts are relatively small and relatively closely spaced. In addition, contacts are provided for making electrical connections between the package substrate and other portions of the circuit in which it is used, such as a printed circuit board. These contacts are relatively larger and more spread out, so that it is relatively easier to make the electrical connections between the printed circuit board and the packaged integrated circuit.

The package substrate typically has many different electrically conductive layers, spaced between non electrically conductive layers, through which the electrical signals are routed. Electrical connections between electrically conductive layers are made by structures called vias, and electrical connections across an electrically conductive layer are made by structures called traces, and also by structures called planes. A trace typically routes a signal, and a plane typically conducts either a power or ground potential.

Obviously, integrated circuits having different contact patterns and functions require different package substrates to route their signals. Such a situation, where each integrated circuit is highly customized and each package substrate is also highly customized and only works with the single integrated circuit for which is was designed, is extremely expensive. Not only are there extravagant design costs associated with each combination, but there are also costs associated with the need to carry a large inventory of different parts.

Thus, integrated circuit designers have attempted to resolve this problem by making integrated circuit contact arrays and functions fit a generic pattern, where given signal, power, and ground contacts are in the same position for all integrated circuit designs. However, this has also proven to be quite undesirable, because the constraints on the design of the integrated circuit are far too rigid.

What is needed, therefore, is a system by which the benefits of versatility of a custom design can be enjoyed, while at the same time enjoying the benefits of the reduction in design and inventory costs afforded by a generic design.

SUMMARY

The above and other needs are met by a method of designing a packaged integrated circuit, including a package substrate and an integrated circuit. The integrated circuit is designed with a plurality of integrated circuit standardized functional blocks. Each of the plurality of integrated circuit standardized functional blocks has a known function and a known integrated circuit contact array pattern. The integrated circuit is designed by selecting desired ones of the integrated circuit standardized functional blocks according to functions desired for the integrated circuit. The package substrate is designed with a plurality of package substrate standardized functional blocks. Each of the plurality of package substrate standardized functional blocks has a known package substrate contact array pattern, a known signal trace routing layer pattern, a known ground plane layer pattern, and a known power plane layer pattern. A given one of each of the plurality of package substrate standardized functional blocks is associated with a given one of the plurality of integrated circuit standardized functional blocks. The package substrate is designed by selecting package substrate standardized functional blocks associated with the desired ones of the integrated circuit standardized functional blocks.

In this manner, the benefits of customized package substrate designs can be enjoyed to a great extent. However, because standardized functional blocks are used, which standardized functional blocks can be kept on record in a library of such, a completely new design process is not needed when different functions are required. Rather, a different set of standardized functional blocks can be selected, for which the design work has already been accomplished, and a reduced amount of design work can be performed to arrange the desired set of standardized functional blocks. This design methodology allows for the quick turn around of designs, without sacrificing design optimization considerations. Built in to the methodology are standard layout practices for each functional block, including both input blocks and core power distribution blocks, across different package designs. Vendor design review cycle times are generally reduced, because each modular component is pre-designed per vendor manufacturing rules. Internal design review and quality assurance cycle times are also reduced. This methodology also provides the ability to characterize functional block performance for a given combination of integrated circuit and package substrate.

In various embodiments, the known signal trace routing layer pattern comprises patterns for a plurality of known signal trace routing layers, the known ground plane routing layer pattern comprises patterns for a plurality of known ground plane routing layers, and the known power plane routing layer pattern comprises patterns for a plurality of known power plane routing layers. The given one of each of the plurality of package substrate standardized functional blocks that is associated with the given one of the plurality of integrated circuit standardized functional blocks are preferably aligned so as to meet between the integrated circuit and the package substrate. Most preferably, the package substrate contact array pattern of the given one of each of the plurality of package substrate standardized functional blocks that is associated with the integrated circuit contact array pattern of the given one of the plurality of integrated circuit standardized functional blocks are aligned so as to meet between the integrated circuit and the package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
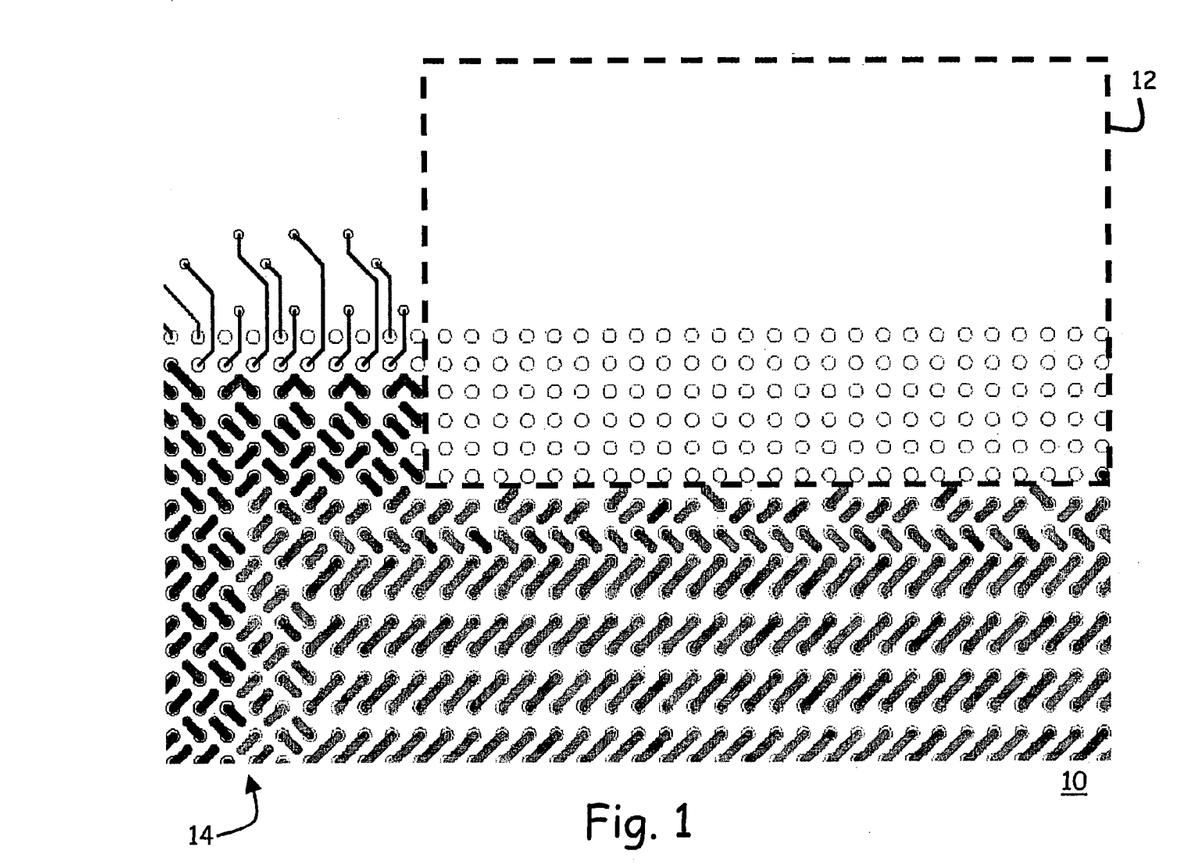
FIG. 1 is a top plan view of a first layer, such as a contact layer, for a first electronic structure, such as a package substrate, prior to inserting a standardized functional module.
Figure 2:
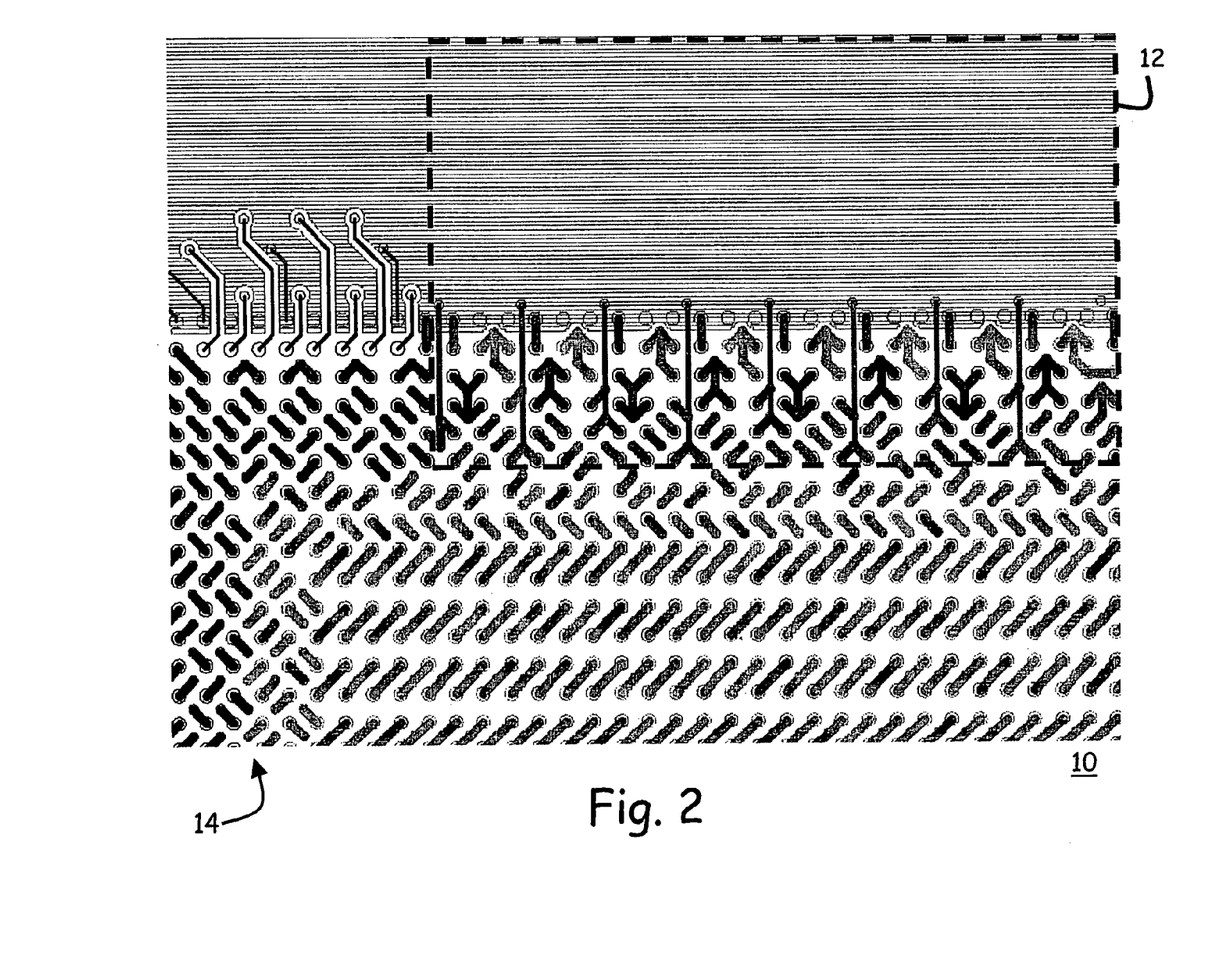
FIG. 2 is a top plan view of a first layer, such as a contact layer, for a first electronic structure, such as a package substrate, after inserting a standardized functional module.

With reference now to FIG. 1, there is depicted a top plan view of a first layer 14, such as a contact layer, for a first electronic structure 10, such as a package substrate, prior to inserting a standardized functional module 12. As depicted in FIG. 1, the space where the standardized functional module 12 is to be inserted is delineated with a dashed border 12, which dashed border represents a logical structure, and is not literally present in the first layer 14 of the first electronic structure 10. FIG. 2 depicts the first layer 14 after the standardized functional module 12 has been inserted.

As seen in FIGS. 1 and 2, the standardized functional module 12 is relatively self contained, in that it can be placed within an area of known size, without disturbing the circuitry around it. The circuitry around the standardized functional module 12 may either be customized circuitry, standardized circuitry, or other standardized functional modules, as desired. As depicted in subsequent figures, the standardized functional module 12 is not just a design for a single layer, such as the contact layer 14, but instead is a relatively self contained design structures for a plurality of layers of the first electronic structure 10.

Figure 3:
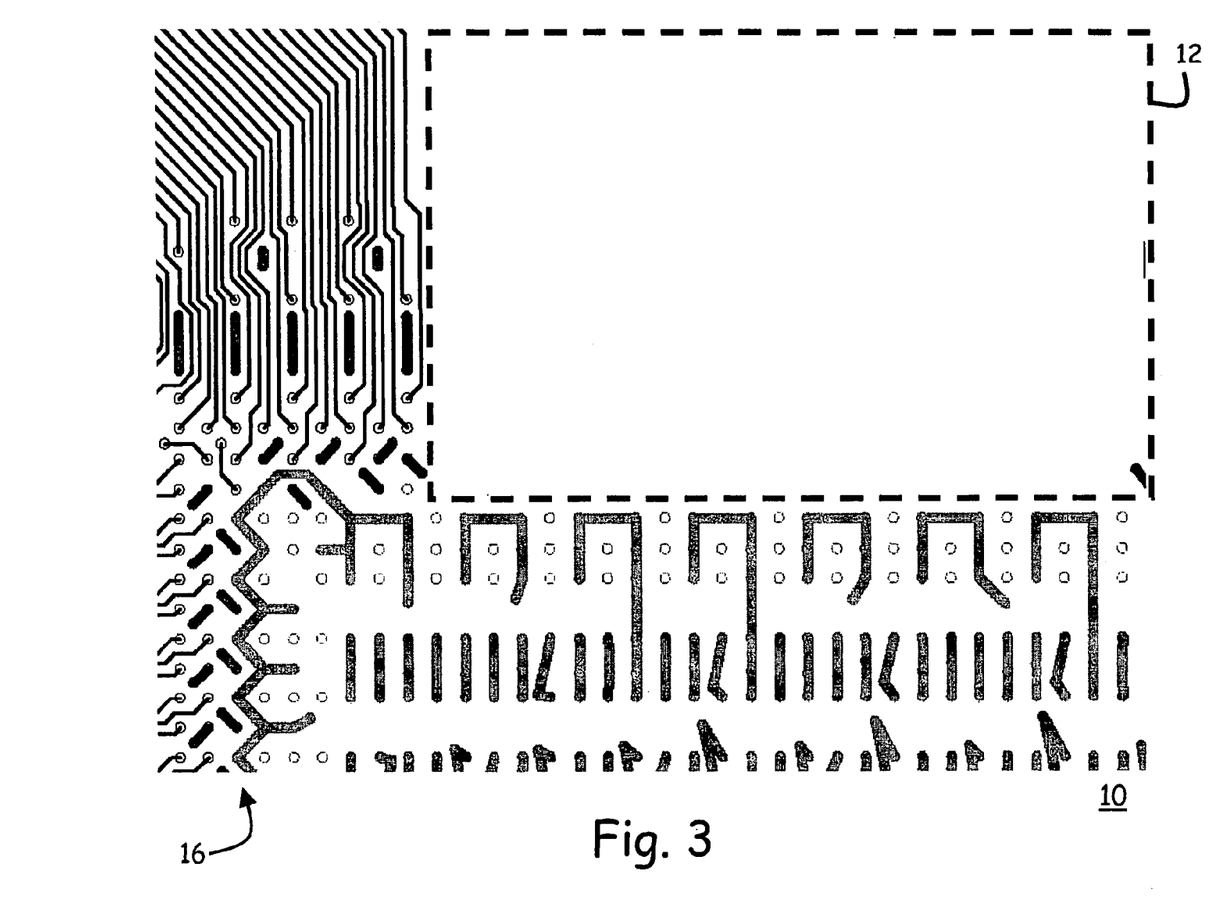
FIG. 3 is a top plan view of a second layer, such as a first signal trace routing layer, for a first electronic structure, such as a package substrate, prior to inserting a standardized functional module.
Figure 4:
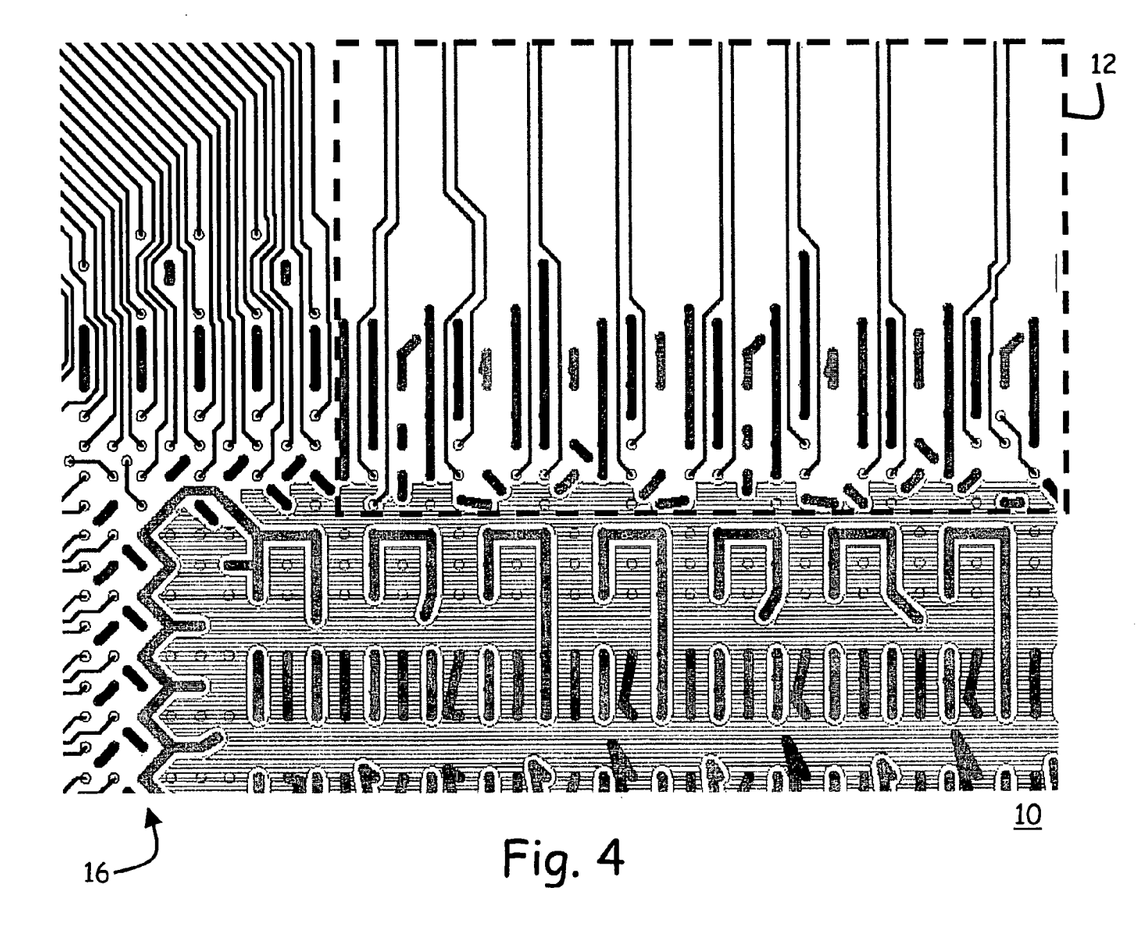
FIG. 4 is a top plan view of a second layer, such as a first signal trace routing layer, for a first electronic structure, such as a package substrate, after inserting a standardized functional module.
Figure 5:
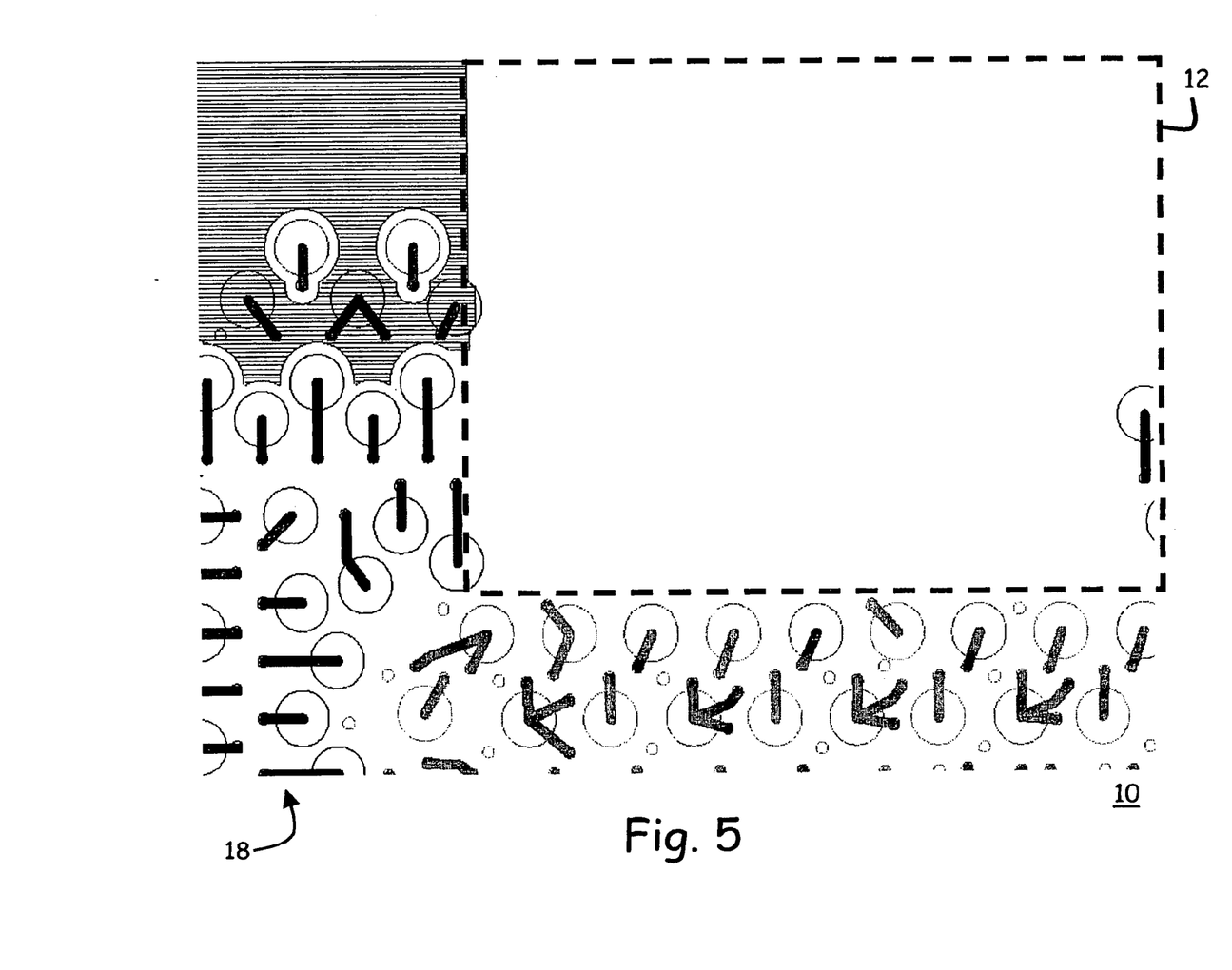
FIG. 5 is a top plan view of a third layer, such as a first core via layer, for a first electronic structure, such as a package substrate, prior to inserting a standardized functional module.
Figure 6:
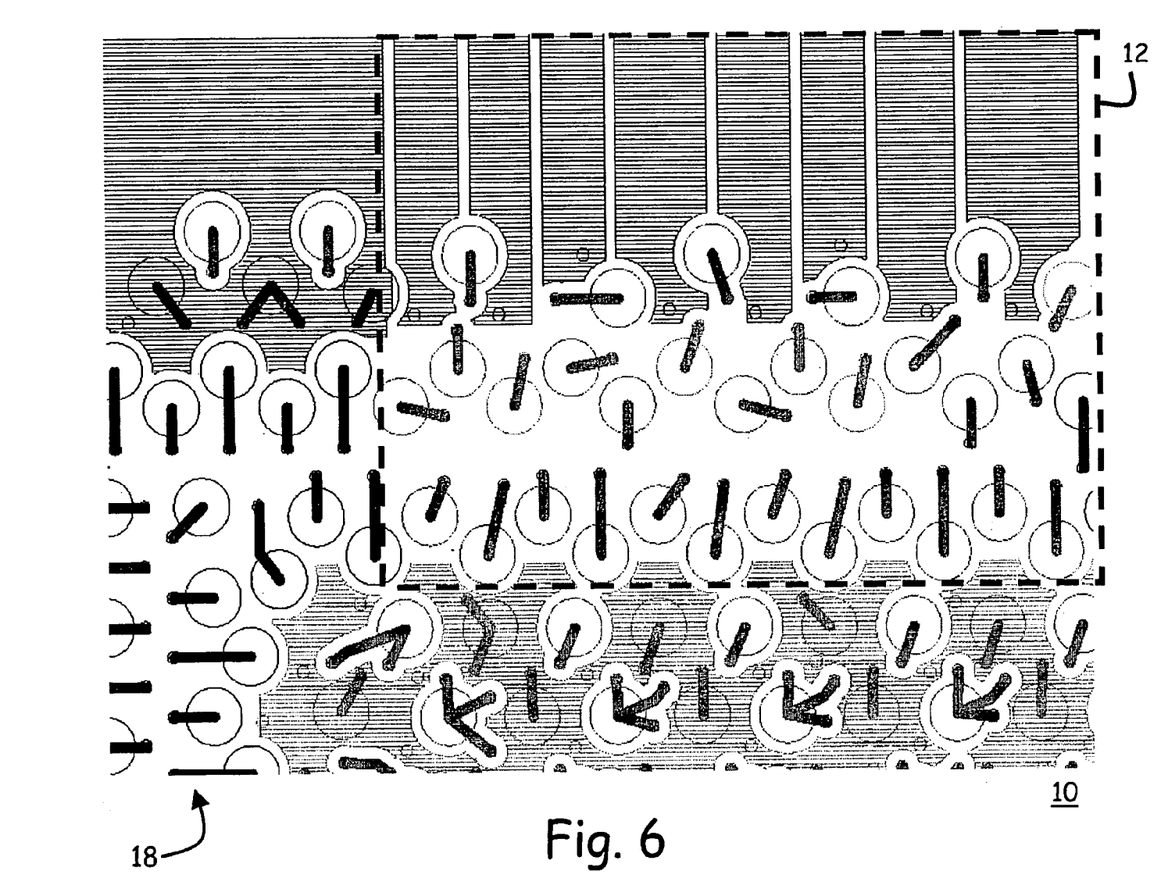
FIG. 6 is a top plan view of a third layer, such as a first core via layer, for a first electronic structure, such as a package substrate, after inserting a standardized functional module.
Figure 7:
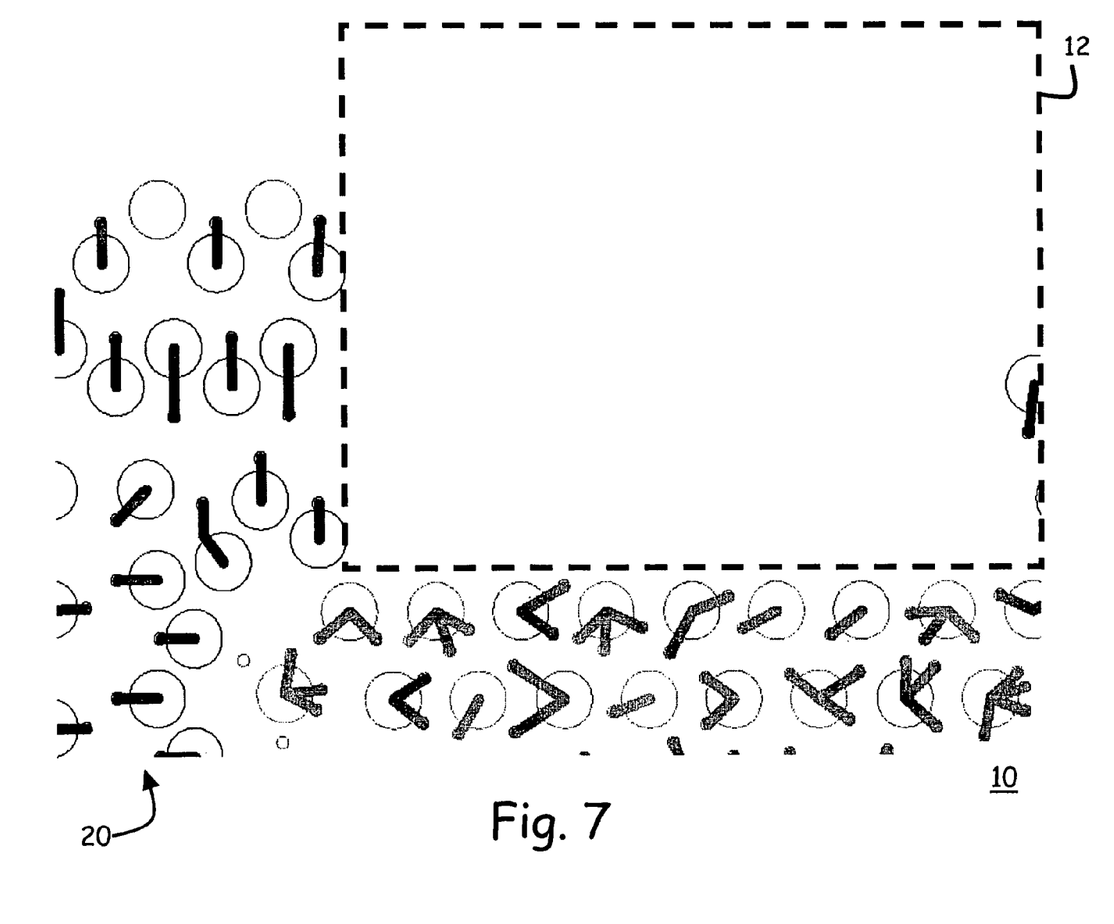
FIG. 7 is a top plan view of a fourth layer, such as a second core via layer, for a first electronic structure, such as a package substrate, prior to inserting a standardized functional module.
Figure 8:
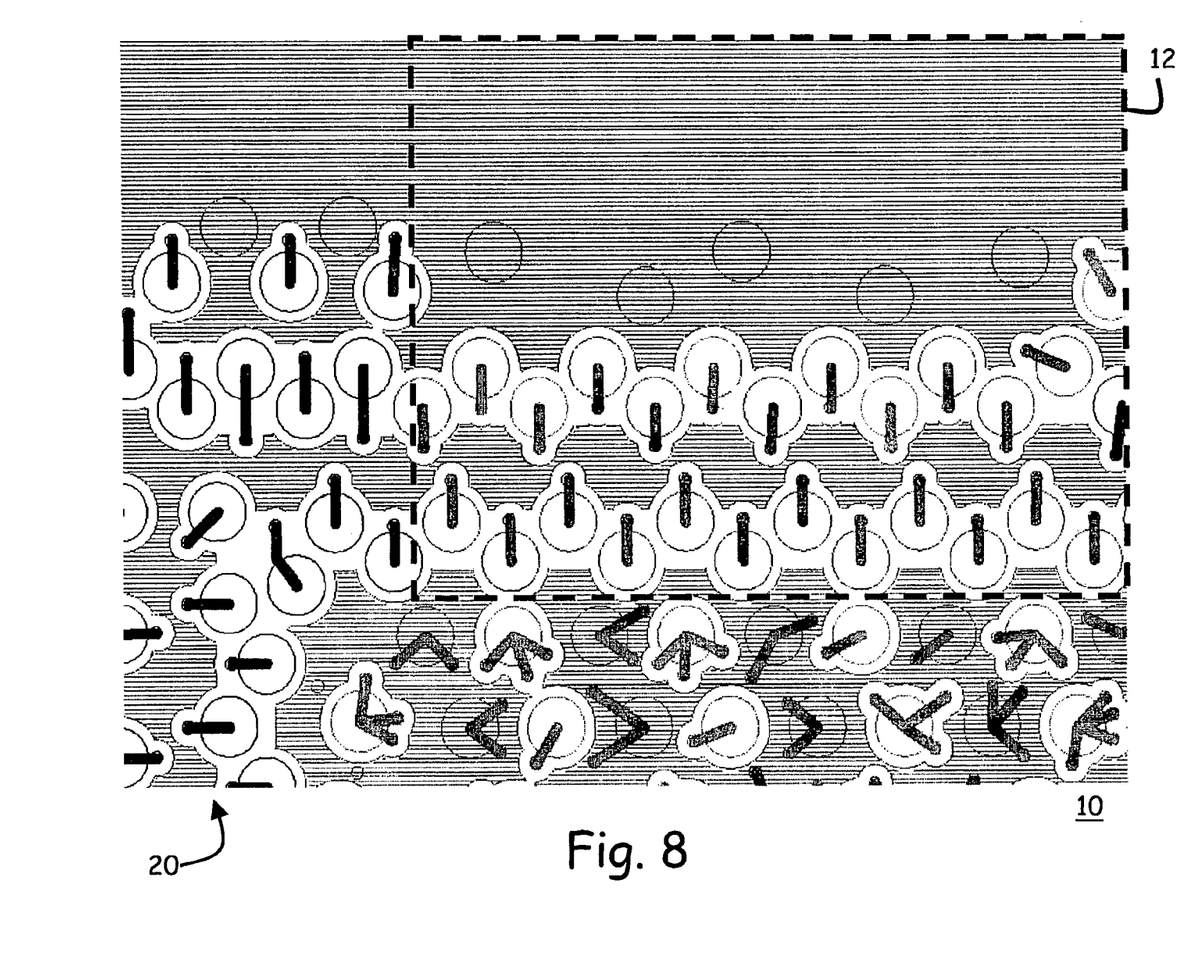
FIG. 8 is a top plan view of a fourth layer, such as a second core via layer, for a first electronic structure, such as a package substrate, after inserting a standardized functional module.

Accordingly, FIG. 3 is a top plan view of a second layer 16, such as a first signal trace routing layer, for the first electronic structure 10, prior to inserting the standardized functional module 12, and FIG. 4 is a top plan view of the second layer 16 after inserting the standardized functional module 12. FIG. 5 is a top plan view of a third layer 18, such as a first core via layer, prior to inserting the standardized functional module 12, and FIG. 6 is a top plan view of the third layer 18 after inserting the standardized functional module 12. FIG. 7 is a top plan view of a fourth layer 20, such as a second core via layer, prior to inserting the standardized functional module 12, and FIG. 8 is a top plan view of the fourth layer 20 after inserting the standardized functional module 12.

Figure 9:
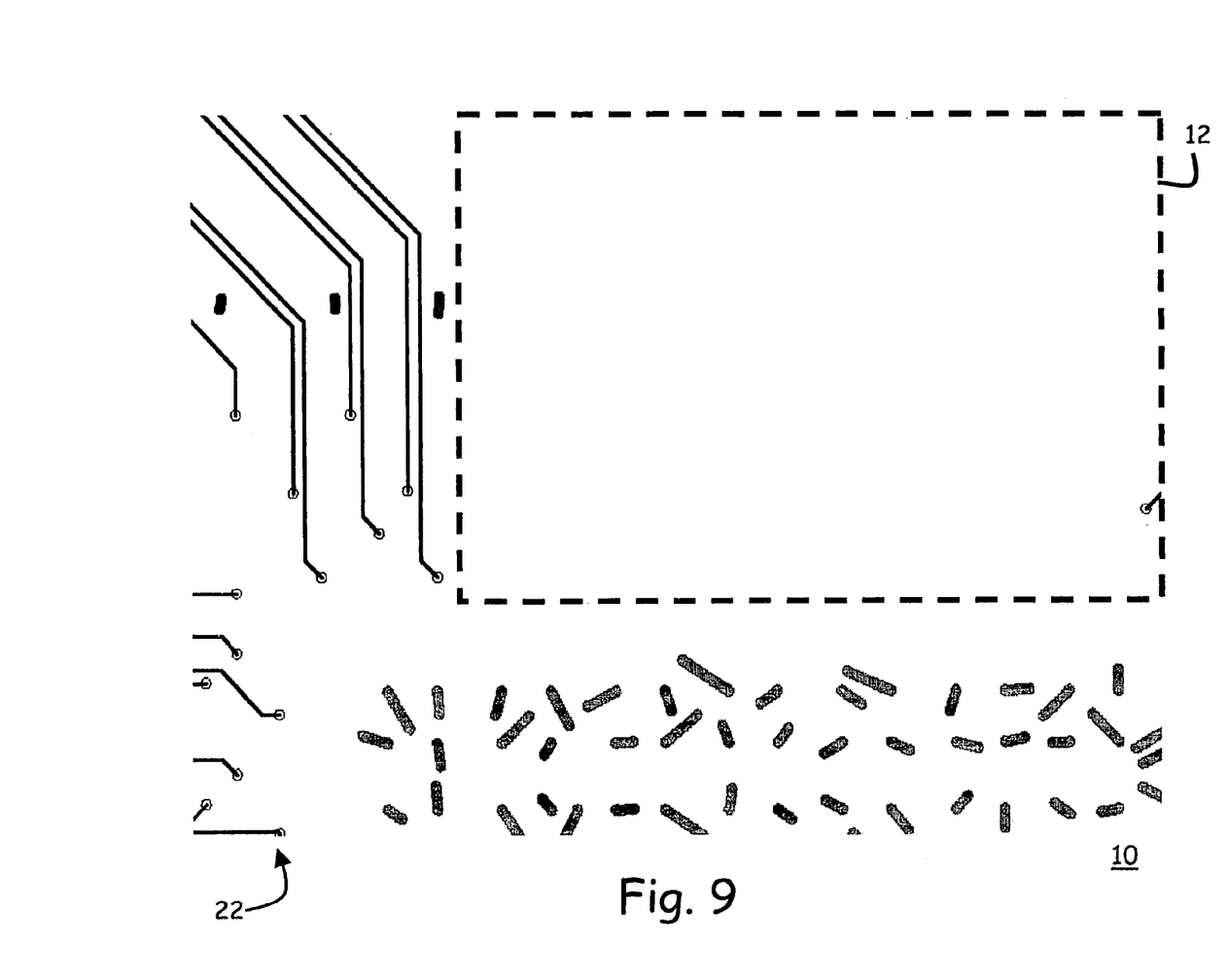
FIG. 9 is a top plan view of a fifth layer, such as a second signal trace routing layer, for a first electronic structure, such as a package substrate, prior to inserting a standardized functional module.
Figure 10:
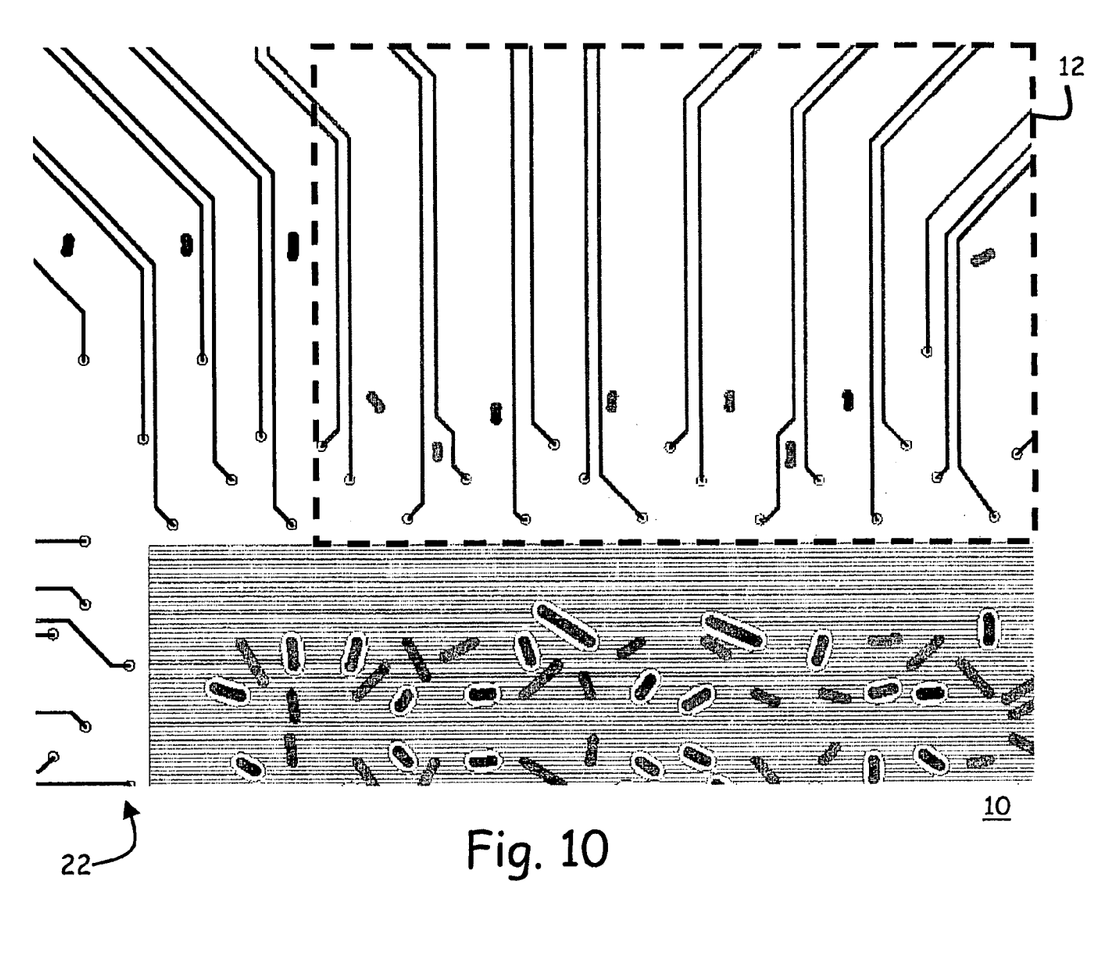
FIG. 10 is a top plan view of a fifth layer, such as a second signal trace routing layer, for a first electronic structure, such as a package substrate, after inserting a standardized functional module.
Figure 11:
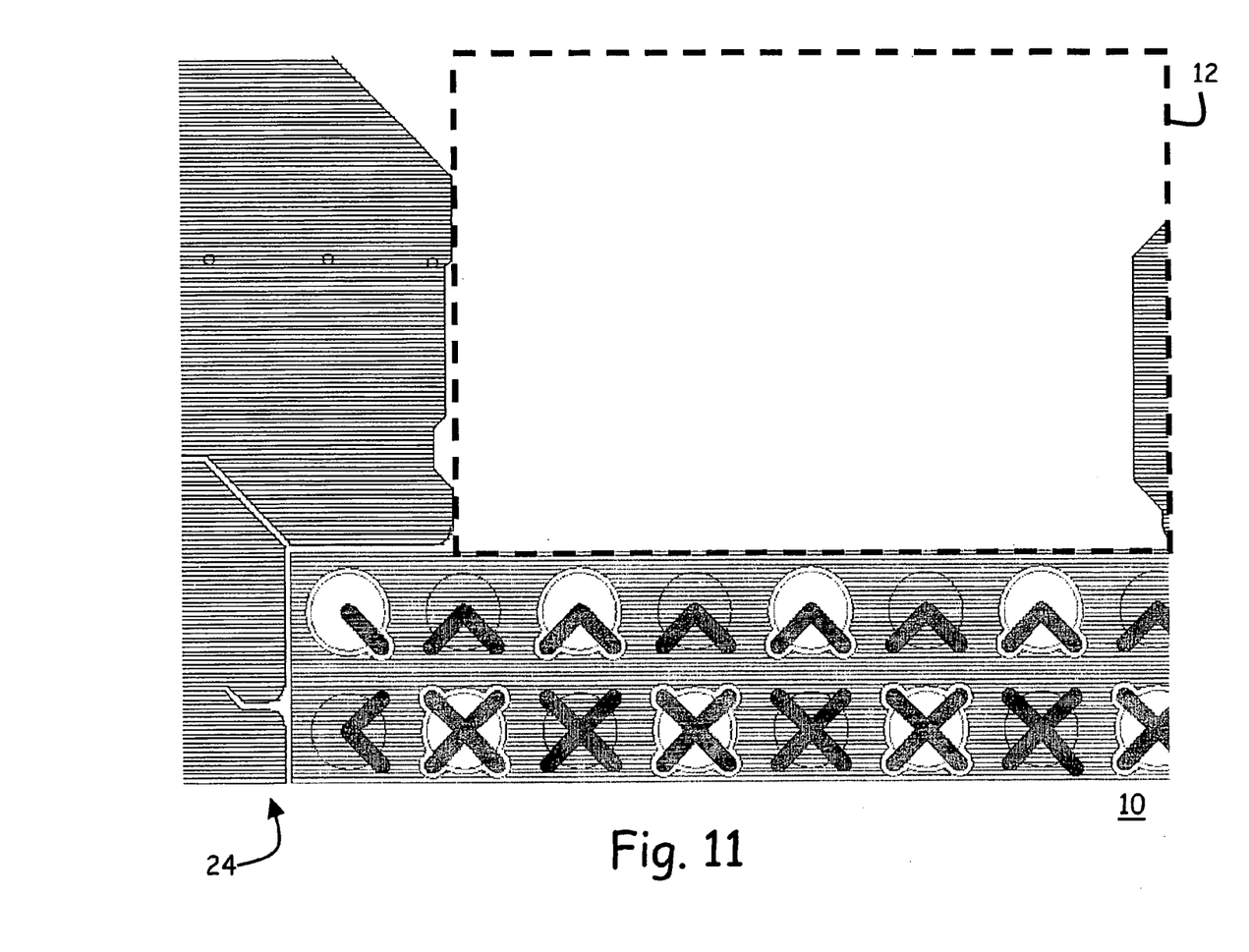
FIG. 11 is a top plan view of a sixth layer, such as a power plane or ground plane layer, for a first electronic structure, such as a package substrate, prior to inserting a standardized functional module.
Figure 12:
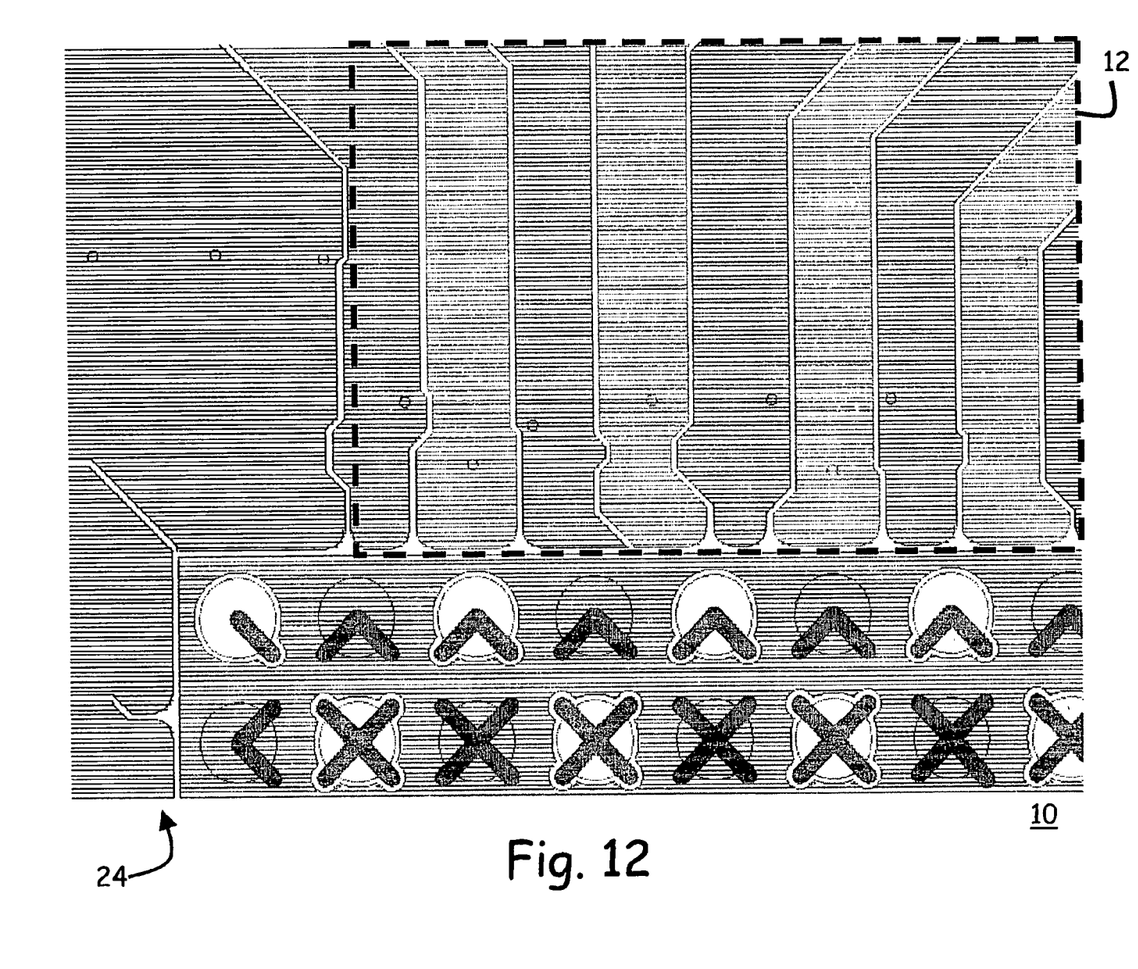
FIG. 12 is a top plan view of a sixth layer, such as a power plane or ground plane layer, for a first electronic structure, such as a package substrate, after inserting a standardized functional module.

FIG. 9 is a top plan view of a fifth layer 22, such as a second signal trace routing layer, prior to inserting the standardized functional module 12, and FIG. 10 is a top plan view of the fifth layer 22 after inserting the standardized functional module 12. FIG. 11 is a top plan view of a sixth layer 24, such as a power plane or ground plane layer, prior to inserting the standardized functional module 12, and FIG. 12 is a top plan view of the sixth layer 24 after inserting the standardized functional module 12.

It is appreciated that the number of layers described above and the functional designation of such layers is by way of example only and not by way of limitation. In any given actual embodiment, the number of layers required may be either more or less than the number depicted and described herein, and the functional designation of those layers actually used may be different from that as depicted and described herein. However, the number and type of layers depicted and described herein are sufficient to understand that the standardized functional block is not just for a single layer, such as a contact layer, but is for many layers within the first electronic structure, and most preferably for all layers with the first electronic structure.

Figure 13:
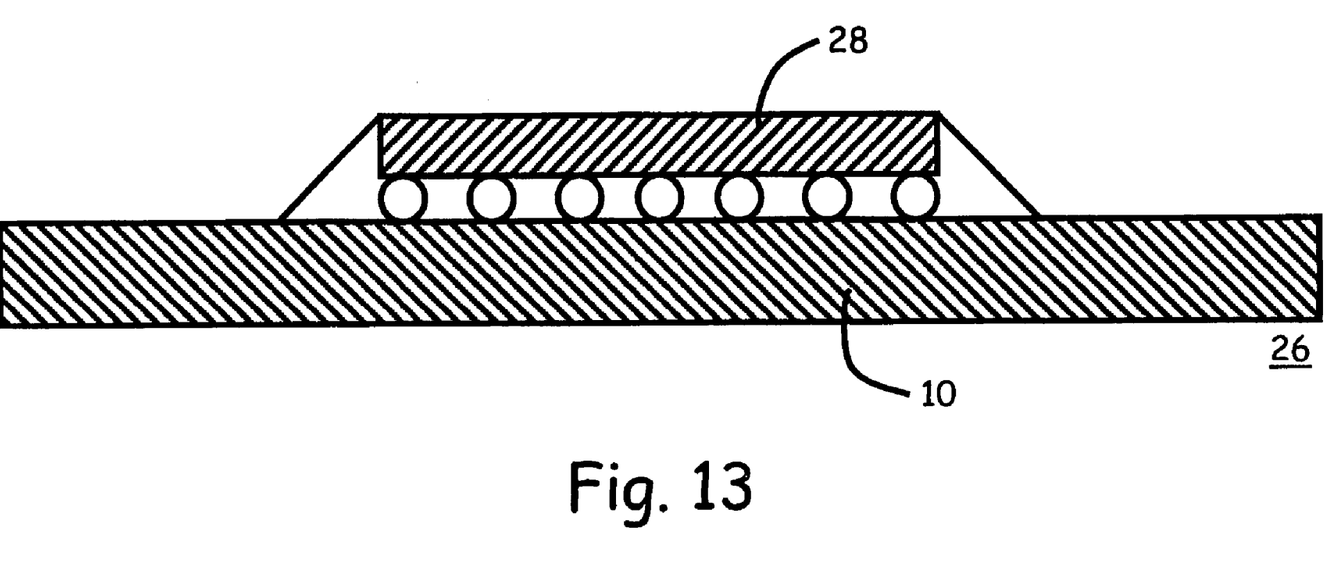
FIG. 13 is a top plan view of a unified electronic structure including both a first electronic structure and a second electronic structure, such as a packaged integrated circuit including both a package substrate and an integrated circuit.

With reference now to FIG. 13 there is depicted a unified electronic structure 26 including both a first electronic structure 10 and a second electronic structure 28, such as a packaged integrated circuit 26 including both a package substrate 10 and an integrated circuit 28. The second electronic structure 28, such as an integrated circuit, is preferably designed using a series of standardized functional blocks having the functions as desired for the integrated circuit. Preferably, there is a set of standardized functional blocks for the first electronic structure 10, such as a package substrate, which corresponds to the set of desired standardized functional blocks that were used in the design of the second electronic structure 28.

At a most basic level, the association between the sets of standardized functional blocks for the first and second electronic structures 10 and 28 means only that the associated standardized functional blocks are designed for support of the same function. However, in more complex levels of implementation, the association can extend to other characteristics as well, such as but not limited to the contact array pattern of each set of standardized functional blocks that is used for making electrical connections between pairs of associated standardized functional blocks in the first electronic structure 10 and second electronic structure 28.

The considerations for establishing the standardized functional blocks of at least the first electronic structure 10, and preferably of both the first and the second electronic structures 10 and 28, preferably include characteristics such as electrical optimization, manufacturing constraints, and input density. These standardized functional blocks can then be placed into a electronic structure design, such as a package substrate design, integrated circuit design, or printed circuit board design, either individually or in combination with each other as dictated by the integrated circuit or other structure layout. This methodology could be applied to any type of package design using any type of integrated circuit to package substrate interconnect.

The standardized functional blocks preferably include custom package routing libraries for specific functional blocks. Because the routing customization for a given functional block only needs to be performed once when the functional block is designed, the benefits of customization are enjoyed, without burdening the design of each electronic structure that makes use of the standardized functional block with such customization costs. By using the methods described herein, multiple standardized functional modules can be placed in an electronic structure design, such as a package substrate design, with minimal routing conflicts. Various standardized modules are preferably designed to accommodate specific pad pitches, package constructions and materials, vendor design rule constraints, and package footprints. Such methods can be applied to, for example, multi chip module designs, system in package designs, or printed circuit board designs.

Although many of the specific embodiments described herein reference the first electronic structure as being a package substrate, it is appreciated that this is not by way of limitation, and the first electronic structure may be a package substrate, a printed circuit board, or some other similar type of structure within the limitations as described herein. Further, although the embodiments described herein generally reference the second electronic structure as being an integrated circuit, such as a flip chip or wire bonded silicon device, it is appreciated that this also is not by way of limitation, and the second electronic structure may be an integrated circuit, a packaged integrated circuit, or some other similar type of structure within the limitations as described herein.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of designing a packaged integrated circuit, including a package substrate and an integrated circuit, the method comprising the steps of:

designing the integrated circuit with a plurality of integrated circuit standardized functional blocks, where each of the plurality of integrated circuit standardized functional blocks has a known function and a known integrated circuit contact array pattern, and the integrated circuit is designed by selecting desired ones of the integrated circuit standardized functional blocks according to functions desired for the integrated circuit, and designing the package substrate with a plurality of package substrate standardized functional blocks, where each of the plurality of package substrate standardized functional blocks has a known package substrate contact array pattern, a known signal trace routing layer pattern, a known ground plane layer pattern, and a known power plane layer pattern, where a given one of each of the plurality of package substrate standardized functional blocks is associated with a given one of the plurality of integrated circuit standardized functional blocks, and the package substrate is designed by selecting package substrate standardized functional blocks associated with the desired ones of the integrated circuit standardized functional blocks, where the given one of each of the plurality of package substrate standardized functional blocks that is associated with the given one of the plurality of integrated circuit standardized functional blocks are aligned so as to meet between the integrated circuit and the package substrate.

2. The method of claim 1 wherein the known signal trace routing layer pattern comprises patterns for a plurality of known signal trace routing layers.

3. The method of claim 1 wherein the known ground plane routing layer pattern comprises patterns for a plurality of known ground plane routing layers.

4. The method of claim 1 wherein the known power plane routing layer pattern comprises patterns for a plurality of known power plane routing layers.

5. A method of designing a packaged integrated circuit, including a package substrate and an integrated circuit, the method comprising the steps of:

designing the integrated circuit with a plurality of integrated circuit standardized functional blocks, where each of the plurality of integrated circuit standardized functional blocks has a known function and a known integrated circuit contact array pattern, and the integrated circuit is designed by selecting desired ones of the integrated circuit standardized functional blocks according to functions desired for the integrated circuit, and designing the package substrate with a plurality of package substrate standardized functional blocks, where each of the plurality of package substrate standardized functional blocks has a known package substrate contact array pattern, a known signal trace routing layer pattern, a known ground plane layer pattern, and a known power plane layer pattern, where a given one of each of the plurality of package substrate standardized functional blocks is associated with a given one of the plurality of integrated circuit standardized functional blocks, and the package substrate is designed by selecting package substrate standardized functional blocks associated with the desired ones of the integrated circuit standardized functional blocks, where the package substrate contact array pattern of the given one of each of the plurality of package substrate standardized functional blocks that is associated with the integrated circuit contact array pattern of the given one of the plurality of integrated circuit standardized functional blocks are aligned so as to meet between the integrated circuit and the package substrate.

6. A method of designing a package substrate for a packaged integrated circuit, including the package substrate and an integrated circuit having a plurality of integrated circuit standardized functional blocks, where each of the plurality of integrated circuit standardized functional blocks has a known function and a known integrated circuit contact array pattern, the method comprising the steps of:

designing the package substrate with a plurality of package substrate standardized functional blocks, where each of the plurality of package substrate standardized functional blocks has a known package substrate contact array pattern, a known signal trace routing layer pattern, a known ground plane layer pattern, and a known power plane layer pattern, where a given one of each of the plurality of package substrate standardized functional blocks is associated with a given one of the plurality of integrated circuit standardized functional blocks, and the package substrate is designed by selecting package substrate standardized functional blocks associated with the integrated circuit standardized functional blocks, where the given one of each of the plurality of package substrate standardized functional blocks that is associated with the given one of the plurality of integrated circuit standardized functional blocks are aligned so as to meet between the integrated circuit and the package substrate.

7. The method of claim 6 wherein the known signal trace routing layer pattern comprises patterns for a plurality of known signal trace routing layers.

8. The method of claim 6 wherein the known ground plane routing layer pattern comprises patterns for a plurality of known ground plane routing layers.

9. The method of claim 6 wherein the known power plane routing layer pattern comprises patterns for a plurality of known power plane routing layers.

10. A method of designing a package substrate for a packaged integrated circuit, including the package substrate and an integrated circuit having a plurality of integrated circuit standardized functional blocks, where each of the plurality of integrated circuit standardized functional blocks has a known function and a known integrated circuit contact array pattern, the method comprising the steps of:

designing the package substrate with a plurality of package substrate standardized functional blocks, where each of the plurality of package substrate standardized functional blocks has a known package substrate contact array pattern, a known signal trace routing layer pattern, a known ground plane layer pattern, and a known power plane layer pattern, where a given one of each of the plurality of package substrate standardized functional blocks is associated with a given one of the plurality of integrated circuit standardized functional blocks, and the package substrate is designed by selecting package substrate standardized functional blocks associated with the integrated circuit standardized functional blocks, where the package substrate contact array pattern of the given one of each of the plurality of package substrate standardized functional blocks that is associated with the integrated circuit contact array pattern of the given one of the plurality of integrated circuit standardized functional blocks are aligned so as to meet between the integrated circuit and the package substrate.

11. A method of designing a first electronic structure for a unified circuit structure, including the first electronic structure and a second electronic structure having a plurality of second standardized functional blocks, where each of the plurality of second functional blocks has a known function and a known second contact array pattern, the method comprising the steps of:

designing the first electronic structure with a plurality of first standardized functional blocks, where each of the plurality of first standardized functional blocks has a known first contact array pattern, a known signal trace routing layer pattern, a known ground plane layer pattern, and a known power plane layer pattern, where a given one of each of the plurality of first standardized functional blocks is associated with a given one of the plurality of second functional blocks, and the first electronic structure is designed by selecting first standardized functional blocks associated with the second functional blocks, where the given one of each of the plurality of first standardized functional blocks that is associated with the given one of the plurality of second functional blocks are aligned so as to meet between the first electronic structure and the second electronic structure.

12. A method of designing a first electronic structure for a unified circuit structure, including the first electronic structure and a second electronic structure having a plurality of second standardized functional blocks, where each of the plurality of second functional blocks has a known function and a known second contact array pattern, the method comprising the steps of:

designing the first electronic structure with a plurality of first standardized functional blocks, where each of the plurality of first standardized functional blocks has a known first contact array pattern, a known signal trace routing layer pattern, a known ground plane layer pattern, and a known power plane layer pattern, where a given one of each of the plurality of first standardized functional blocks is associated with a given one of the plurality of second functional blocks, and the first electronic structure is designed by selecting first standardized functional blocks associated with the second functional blocks, where the first contact array pattern of the given one of each of the plurality of first standardized functional blocks that is associated with the second contact array pattern of the given one of the plurality of second standardized functional blocks are aligned so as to meet between the first electronic structure and the second electronic structure.

* * * * *